United States Patent
Jung et al.

(10) Patent No.: US 9,608,137 B2
(45) Date of Patent: Mar. 28, 2017

(54) COMPOSITION FOR SOLAR CELL ELECTRODES AND ELECTRODE FABRICATED USING THE SAME

(71) Applicant: SAMSUNG SDI CO., LTD., Yongin-si, Gyeonggi-do (KR)

(72) Inventors: Seok Hyun Jung, Uiwang-si (KR); Tae Joong Kim, Uiwang-si (KR); Tae Joon Kim, Uiwang-si (KR); Hun Gyu Song, Uiwang-si (KR); Dong Il Shin, Uiwang-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 14/712,540

(22) Filed: May 14, 2015

(65) Prior Publication Data

US 2015/0249168 A1 Sep. 3, 2015

Related U.S. Application Data

(63) Continuation of application No. 14/249,711, filed on Apr. 10, 2014.

(30) Foreign Application Priority Data

Apr. 11, 2013 (KR) ........................ 10-2013-0040125

(51) Int. Cl.
*H01B 1/22* (2006.01)
*H01L 31/0224* (2006.01)

(52) U.S. Cl.
CPC ....... *H01L 31/022425* (2013.01); *H01B 1/22* (2013.01)

(58) Field of Classification Search
None
See application file for complete search history.

(56) References Cited

U.S. PATENT DOCUMENTS

| 6,436,316 | B2 * | 8/2002 | Matsumoto | .................. 252/512 |
| 2002/0005507 | A1 | 1/2002 | Matsumoto | |
| 2004/0070915 | A1 * | 4/2004 | Nagai et al. | .................. 361/234 |
| 2013/0160830 | A1 * | 6/2013 | Ionkin | ........................ 136/256 |
| 2015/0280024 | A1 * | 10/2015 | Song | .............. H01L 31/022425 |
| | | | | 136/256 |

FOREIGN PATENT DOCUMENTS

| CN | 102157219 A | 8/2011 | |
| CN | 102592704 A | 7/2012 | |
| JP | 2004 355862 | * 12/2004 | |
| JP | 2004355862 A | 12/2004 | |
| JP | 3734731 B2 | 1/2006 | |
| JP | 2011 228481 | * 11/2011 | |
| JP | 2011228481 A | 11/2011 | |
| KR | 10-2007-0055489 A | 5/2007 | |
| KR | 10-2010-0069950 A | 6/2010 | |
| KR | 10-2011-0040713 A | 4/2011 | |
| KR | 20130024390 A | 3/2013 | |
| KR | WO 2015037798 A1 * | 3/2015 | ............... H01B 1/22 |
| WO | WO 2011/140205 A1 | 11/2011 | |
| WO | WO-2012-020694 A1 | 2/2012 | |

* cited by examiner

*Primary Examiner* — Tanisha Diggs
(74) *Attorney, Agent, or Firm* — Lee & Morse, P.C.

(57) ABSTRACT

A composition for solar cell electrodes includes a conductive powder, a glass frit, an organic vehicle and a thixotropic agent, and has a first thixotropic index (TI I) of about 1.5 to about 4 as represented by the following Equation 1, and a second thixotropic index (TI II) of about 4 to about 8 as represented by the following Equation 2, both the first thixotropic index and the second thixotropic index being measured at 23° C. by a rotary viscometer. [Equation 1] TI I=(viscosity at 1 rpm/viscosity at 10 rpm) [Equation 2] TI II=(viscosity at 10 rpm/viscosity at 100 rpm).

7 Claims, 1 Drawing Sheet

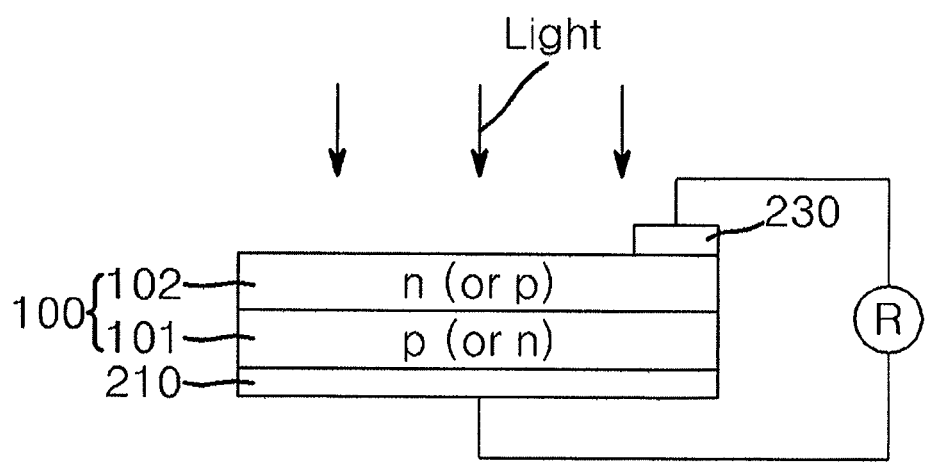

COMPOSITION FOR SOLAR CELL ELECTRODES AND ELECTRODE FABRICATED USING THE SAME

CROSS-REFERENCE TO RELATED APPLICATIONS

This is a continuation application based on pending application Ser. No. 14/249,711, filed Apr. 10, 2014, the entire contents of which is hereby incorporated by reference. Korean Patent Application No. 10-2013-0040125, filed on Apr. 11, 2013, in the Korean Intellectual Property Office, and entitled: "Composition for Solar Cell Electrodes and Electrode Fabricated Using the Same," is incorporated by reference herein in its entirety.

FIELD

Embodiments relate to a composition for solar cell electrodes and electrodes produced using the same.

DESCRIPTION OF THE RELATED ART

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes.

SUMMARY

Embodiments are directed to a composition for solar cell electrodes including a conductive powder, a glass frit, an organic vehicle and a thixotropic agent, and has a first thixotropic index (TI I) of about 1.5 to about 4 as represented by the following Equation 1, and a second thixotropic index (TI II) of about 4 to about 8 as represented by the following Equation 2, both the first thixotropic index and the second thixotropic index being measured at 23° C. by a rotary viscometer.

TI I=(viscosity at 1 rpm/viscosity at 10 rpm)     [Equation 1]

TI II=(viscosity at 10 rpm/viscosity at 100 rpm)     [Equation 2]

The composition may include about 50 wt % to about 90 wt % of the conductive powder; about 1 wt % to about 15 wt % of the glass frit; about 5 wt % to about 40 wt % of the organic vehicle; and about 0.01 wt % to about 2 wt % of the thixotropic agent.

The conductive powder may include at least one selected silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO).

The glass frit may include a leaded glass frit, a lead-free glass frit, or a mixture thereof.

The thixotropic agent may include at least one compound selected from an amine compound, a castor oil compound, a carbon black compound, a fumed silica compound, an organo-clay compound, and nano-scale organic/inorganic particles.

The glass fit may have an average particle diameter (D50) of about 0.1 µm to about 5 µm.

The composition may further include at least one additive selected from a dispersant, a plasticizer, a viscosity stabilizer, an anti-foaming agent, a UV stabilizer, an antioxidant, and a coupling agent.

Embodiments are also directed to a solar cell electrode produced from the composition for solar cell electrodes.

BRIEF DESCRIPTION OF THE DRAWING

Features will become apparent to those of skill in the art by describing in detail exemplary embodiments with reference to the attached drawing in which:

FIG. 1 illustrates a schematic view of a solar cell in accordance with an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figure, the dimensions of layers and regions may be exaggerated for clarity of illustration.

Composition for Solar Cell Electrodes

A composition for solar cell electrodes according to embodiments includes a conductive powder (A), a glass frit (B), an organic vehicle (C) and a thixotropic agent (D). The composition may be printable in a fine linewidth and a high aspect ratio on a substrate by screen-printing.

Now, each component of the composition for solar cell electrodes according to the present embodiments will be described in more detail.

(A) Conductive Powder

As the conductive powder, a suitable organic or inorganic powder having conductivity may be used. For example, the conductive powder may include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), or indium tin oxide (ITO) powder. These conductive powders may be used alone or in combination of two or more thereof. For example, the conductive powder may include silver (Ag) powder, and may further include nickel (Ni), cobalt (Co), iron (Fe), zinc (Zn) or copper (Cu) powders.

The conductive powder may have an average particle diameter (D50) of about 0.1 µm to about 10 µm. For example, the conductive powder may have an average particle diameter of about 0.2 µm to about 7 µm, or, for example, about 0.5 µm to about 5 µm.

The conductive powder may be present in an amount of about 50 wt % to about 90 wt % based on the total weight of the composition. For example, the conductive powder may be present in an amount of about 70 wt % to about 90 wt %. Within this range, the conductive powder may prevent deterioration in conversion efficiency due to resistance increase and difficulty in forming the paste due to relative reduction in amount of the organic vehicle, while providing suitable dispersion, fluidity, and printability to the composition.

(B) Glass Frit

The glass frit may serve to enhance adhesion between the conductive powder and the wafer or the substrate and to form silver crystal grains in an emitter region by etching an anti-reflection layer and melting the silver powder so as to reduce contact resistance during the baking process of the composition for electrodes. Further, during the baking process, the glass frit may soften and allow for decrease of the baking temperature.

When the area of the solar cell is increased in order to improve solar cell efficiency, there may be increase in solar cell contact resistance. Thus, it may be desirable to minimize both serial resistance (Rs) and an influence on the p-n junction. In addition, the baking temperatures may vary within a broad range with increasing use of various Wafers having different sheet resistances. Accordingly, it may be desirable that the glass frit secure sufficient thermal stability to withstand a wide range of baking temperatures.

The glass frit may be at least one of a leaded glass frit and a lead-free glass frit.

In one embodiment, the glass frit may include at least one metal oxide selected from lead oxide, silicon oxide, tellurium oxide, bismuth oxide, zinc oxide, boron oxide, aluminum oxide, tungsten oxide, and combinations thereof. For example, the glass frit may include at least one selected from zinc oxide-silicon oxide ($ZnO$—$SiO_2$), zinc oxide-boron oxide-silicon oxide ($ZnO$-$B_2O_3$—$SiO_2$), zinc oxide-boron oxide-silicon oxide-aluminum oxide ($ZnO$-$B_2O_3$—$SiO_2$—$Al_2O_3$), bismuth oxide-silicon oxide ($Bi_2O_3$—$SiO_2$), bismuth oxide-boron oxide-silicon oxide ($Bi_2O_3$—$B_2O_3$—$SiO_2$), bismuth oxide-boron oxide-silicon oxide-aluminum oxide ($Bi_2O_3$—$B_2O_3$—$SiO_2$—$Al_2O_3$), bismuth oxide-zinc oxide-boron oxide-silicon oxide ($Bi_2O_3$—$ZnO$-$B_2O_3$—$SiO_2$), bismuth oxide-zinc oxide-boron oxide-silicon oxide-aluminum oxide ($Bi_2O_3$—$ZnO$—$B_2O_3$—$SiO_2$—$Al_2O_3$) glass frits, and the like.

The glass frit may be prepared from such metal oxides by a suitable method. For example, the metal oxides may be mixed in a predetermined ratio. Mixing may be carried out using a ball mill or a planetary mill. The mixture may be melted at about 900° C. to about 1300° C., followed by quenching to about 25° C. The obtained resultant may be subjected to pulverization using a disk mill, a planetary mill, or the like, thereby preparing a glass frit.

The glass frit may have an average particle diameter D50 of about 0.1 μm to about 10 μm. The glass frit may have a spherical or amorphous shape.

The glass fit may be obtained commercially or may be prepared by selectively melting, for example, silicon oxide ($SiO_2$), aluminum oxide ($Al_2O_3$), boron oxide ($B_2O_3$), bismuth oxide ($Bi_2O_3$), sodium oxide ($Na_2O$), zinc oxide ($ZnO$), or the like, so as to have a desired composition.

The glass frit may be present in an amount of about 1 wt % to about 15 wt %, or, for example, about 2 wt % to about 10 wt %, based on the total weight of the composition. Within this content range, the glass frit may provide suitable dispersion, fluidity, and printability to the composition.

(C) Organic Vehicle

The organic vehicle may impart suitable viscosity and rheological characteristics for printing to the composition for solar cell electrodes through mechanical mixing with the inorganic component of the composition.

The organic vehicle may be an organic vehicle suitable for use in solar cell electrode compositions, and may include a binder resin, a solvent, or the like.

The binder resin may be selected from acrylate resins or cellulose resins. For example, ethyl cellulose may be used as the binder resin. In other implementations, the binder resin may be selected from among ethyl hydroxyethyl cellulose, nitrocellulose, blends of ethyl cellulose and phenol resins, alkyd, phenol, acrylate ester, xylene, polybutane, polyester, urea, melamine, vinyl acetate resins, wood rosin, polymethacrylates of alcohols, and the like.

The solvent may be selected, for example, from the group of hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, texanol, methylethylketone, benzylalcohol, γ-butyrolactone, ethyl lactate, and combinations thereof.

The organic vehicle may be present in an amount of about 5 wt % to about 40 wt % based on the total weight of the composition. Within this range, the organic vehicle may provide sufficient adhesive strength and excellent printability to the composition.

(D) Thixotropic Agent

The composition may include a thixotropic agent. The thixotropic agent may include at least one compound selected from the group of an amine compound, a castor oil compound, a carbon black compound, a fumed silica compound, an organo-clay compound, and nano-scale organic/inorganic particles.

For example, an amine-based thixotropic agent may be THIXATROL P600 (Elementis), a castor oil-based thixotropic agent may be THIXATROL ST (Elementis), a carbon black-based thixotropic agent may be VULCAN XC72 (Cabot), a fumed silica-based thixotropic agent may be A200 (Evonik), and an organo clay-based thixotropic agent may be BENTONE SD-3 (Elementis).

The thixotropic agent may be present in an amount of about 0.01 wt % to about 2 wt %, or, for example, about 0.05 wt % to about 1 wt %, based on the total weight of the composition. Within this range, the thixotropic agent may provide sufficient adhesive strength and excellent printability to the composition.

(E) Other Additives

The additives may include dispersants, plasticizers, viscosity stabilizers, anti-foaming agents, UV stabilizers, antioxidants, coupling agents, or the like. These additives may be used alone or as mixtures thereof. These additives may be present in an amount of about 0.1 wt % to about 5 wt % based on the total weight of the composition, for example.

The composition for solar cell electrodes may be used for screen-printing, and may have a first thixotropic index (TI I) of about 1.5 to about 4 as represented by the following Equation 1, and a second thixotropic index (TI II) of about 4 to about 8 as represented by the following Equation 2. Here, both the first and second thixotropic indexes are measured at 23° C. by a rotary viscometer.

$$TI\ I = (\text{viscosity at 1 rpm/viscosity at 10 rpm}) \quad [\text{Equation 1}]$$

$$TI\ II = (\text{viscosity at 10 rpm/viscosity at 100 rpm}) \quad [\text{Equation 2}]$$

A thixotropic index (TI) may be defined as a ratio of viscosity values measured at different revolutions per minute of a rotary viscometer as in Equations 1 and 2. The first thixotropic index (TI I) represents a ratio of the viscosity at 1 rpm to the viscosity at 10 rpm as measured by the rotary viscometer at 23° C. The second thixotropic index (TI II) represents a ratio of the viscosity at 10 rpm to the viscosity at 100 rpm as measured by the rotary viscometer at 23° C.

The composition for solar cell electrodes may have a viscosity of about 200 Pa·s to about 600 Pa·s, for example, with regard to printability. Here, the viscosity may be measured by the rotary viscometer at 23° C. and 10 rpm.

When the composition for solar cell electrodes is printed on a substrate, particularly, by screen-printing, the printed pattern may have a linewidth of about 40 μm to about 100 μm and a line thickness of about 3 μm to about 40 μm. Further, the composition may provide an aspect ratio (line thickness/linewidth) of about 0.21 or more, or, for example, about 0.24 to about 0.5. Within this range of aspect ratio, the composition may exhibit excellent printability.

Solar Cell Electrode and Solar Cell Including the Same

Embodiments also relate to an electrode formed of the composition for solar cell electrodes and a solar cell including the same. FIG. 1 shows a solar cell in accordance with an embodiment.

Referring to FIG. 1, a rear electrode 210 and a front electrode 230 may be formed by printing and baking the composition on a wafer or substrate 100 that includes a p-layer (or n-layer) 101 and an n-layer (or p-layer) 102, which will serve as an emitter. For example, a preliminary process of preparing the rear electrode may be performed by printing the composition on the rear surface of the wafer and drying the printed composition at about 200° C. to about 400° C. for about 10 seconds to about 60 seconds. Further, a preliminary process for preparing the front electrode may be performed by printing the paste on the front surface of the wafer and drying the printed composition. Then, the front electrode and the rear electrode may be formed by baking the wafer at about 400° C. to about 950° C., of, for example, at about 750° C. to about 950° C., for about 30 seconds to about 50 seconds.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

EXAMPLES

Examples 1 to 4 and Comparative Examples 1 to 4

Example 1

As an organic binder, 1 wt % of ethyl cellulose (STD4, Dow Chemical Company) was sufficiently dissolved in 12.5 wt % of butyl carbitol at 60° C. to prepare an organic vehicle, and 81 wt % of a spherical silver powder (AG-4-8, Dowa Hightech Co., Ltd.) having an average particle diameter of 2.0 μm, 5.0 wt % of a low melting point leaded glass frit (leaded glass, CI-5008, Particlogy Co., Ltd.) having an average particle diameter of 1.0 μm and a transition point of 430° C., 0.2 wt % of a dispersant BYK102 (BYK-Chemie), and 0.3 wt % of a thixotropic agent Thixatrol ST (Elementis Co.) were added to the organic vehicle, followed by mixing and kneading in a 3-roll kneader, thereby preparing a composition for solar cell electrodes.

The composition was printed in a predetermined pattern over a surface of a wafer by screen-printing. Properties of the composition were measured by the following method and results are shown in the following Table 2.

Examples 2 to 5 and Comparative Examples 1 to 2

Compositions for solar cell electrodes were prepared in the same manner as in Example 1 except that the components of the compositions were used in amounts as listed in Table 2. Thereafter, the compositions were printed by screen-printing Property Measurement Measurement of thixotropic index (TI): The thixotropic index was calculated using the ratio of viscosity values measured at 23° C. using Spindle No. 14 by a rotary viscometer HBDV-II+Pro (Brookfield Co., Ltd.). For measurement of viscosity, a sample cup was completely filled with a specimen and equipped with the spindle. After temperature stabilization for 5 minutes, viscosity was measured at the following maintenance times.

TABLE 1

|  | 1 rpm | 2 rpm | 5 rpm | 10 rpm | 50 rpm | 100 rpm |
|---|---|---|---|---|---|---|
| Maintenance time | 60 sec | 30 sec | 15 sec | 15 sec | 15 sec | 15 sec |

Measurement of printability: Each of the compositions for solar cell electrodes prepared as above was printed in a predetermined pattern over a surface of a wafer using a screen mask designed to have a linewidth of 50 μm by screen-printing. The printed wafer was dried, baked, and observed at 9 portions of the pattern through a three-dimensional microscope, followed by confirmation of disconnection of the pattern through an EL analyzer.

Measurement of aspect ratio: Each of the compositions for solar cell electrodes prepared as above was printed in a predetermined pattern over a surface of a wafer using a screen mask designed to have a linewidth of 50 μm by screen-printing. The printed wafer was dried, baked, and observed at 9 portions of the pattern through a three-dimensional microscope. The aspect ratio was obtained as an average value.

TABLE 2

|  | Example 1 | Example 2 | Example 3 | Example 4 | Example 5 | Comp. Example 1 | Comp. Example 2 | Comp. Example 3 | Comp. Example 4 |
|---|---|---|---|---|---|---|---|---|---|
| (A) Conductive powder | 81 | 81 | 70 | 90 | 81 | 81 | 81 | 65 | 91 |
| (B) Glass frit | 5 | 5 | 5 | 5 | 2 | 5 | 5 | 5 | 2 |
| (C) Organic vehicle | 13.75 | 13.3 | 12.8 | 23.8 | 7.75 | 13.8 | 12.3 | 28.3 | 5.7 |
| (D) Thixotropic agent | 0.05 | 0.5 | 1 | 1 | 0.05 | 0 | 1.5 | 1.5 | 0.01 |
| (E) Dispersant | 0.2 | 0.2 | 0.2 | 0.2 | 0.2 | 0.2 | 0.2 | 0.2 | 1.29 |
| TI I 1 rpm/10 rpm | 4 | 2 | 1.5 | 2 | 1.5 | 5 | 1.2 | 1.1 | 6.2 |
| TI II 10 rpm/100 rpm | 8 | 7 | 8 | 4 | 7 | Unmeasurable | 9 | 3 | Unmeasurable |

TABLE 2-continued

|  | Example 1 | Example 2 | Example 3 | Example 4 | Example 5 | Comp. Example 1 | Comp. Example 2 | Comp. Example 3 | Comp. Example 4 |
|---|---|---|---|---|---|---|---|---|---|
| 50 μm printability (Number of disconnected lines) | 2 | 1 | 2 | 3 | 2 | 17 | 13 | 5 | 15 |
| Aspect ratio (higher-is-better) | 0.27 | 0.29 | 0.31 | 0.21 | 0.23 | 0.17 | 0.19 | 0.1 | 0.19 |

(Units of A, B, C, D, and E: wt %)

In Table 2, it may be seen that the compositions prepared in Examples 1 to 5 had a significantly lower number of disconnected lines and a higher aspect ratio of the printed pattern than the compositions of Comparative Examples 1 to 4, the first and second thixotropic indexes of which were not within the range of the embodiments.

By way of summation and review, electrodes of a solar cell may be formed on the wafer by applying, patterning, and baking an electrode composition. It is desirable to use a composition for solar cell electrodes that is printable with a fine linewidth and a high aspect ratio on a substrate. Generally, methods of printing a composition for solar cell electrodes on a substrate may include a gravure offset printing method and a screen-printing method. Gravure offset printing may be significantly influenced by viscosity, dryness, and adhesion of the composition, and screen-printing may be significantly influenced by rheology or thixotrophy. It may be difficult to produce a printed pattern with a fine linewidth and a high aspect ratio.

Embodiments provide a composition for solar cell electrodes that are printable with a fine linewidth and a high aspect ratio on a substrate by screen-printing, and electrodes produced using the same.

Example embodiments have been disclosed herein, and although specific terms are employed, they are used and are to be interpreted in a generic and descriptive sense only and not for purpose of limitation. Accordingly, it is to be understood by those of skill in the art that various changes in form and details may be made without departing from the spirit and scope thereof as set forth in the following claims.

What is claimed is:

1. A composition for a solar cell electrode, the composition comprising:
    a conductive powder;
    a glass frit;
    an organic vehicle; and
    a thixotropic agent, wherein the thixotropic agent includes at least one selected from an amine compound, a castor oil compound, a carbon black compound, a fumed silica compound, and an organo-clay compound,
    wherein a combination of the organic vehicle and the thixotropic agent, and amounts thereof, are selected such that the composition-has a first thixotropic index (TI I) of 1.5 to 2 as represented by the following Equation 1, and a second thixotropic index (TI II) of about 4 to about 8 as represented by the following Equation 2, such that the first thixotropic index is lower than the second thixotropic index, both the first thixotropic index and the second thixotropic index being measured at 23° C. by a rotary viscometer TI I=(viscosity at 1 rpm/viscosity at 10 rpm)  [Equation 1]

TI II=(viscosity at 10 rpm/viscosity at 100 rpm)  [Equation 2].

2. The composition according as claimed in claim 1, wherein the composition includes:
    about 50 wt % to about 90 wt % of the conductive powder;
    about 1 wt % to about 15 wt % of the glass frit;
    about 5 wt % to about 40 wt % of the organic vehicle; and
    about 0.01 wt % to about 2 wt % of the thixotropic agent.

3. The composition as claimed in claim 1, wherein the conductive powder includes at least one selected from silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO).

4. The composition as claimed in claim 1, wherein the glass frit includes a leaded glass frit, a lead-free glass frit, or a mixture thereof.

5. The composition as claimed in claim 1, wherein the glass frit has an average particle diameter (D50) of about 0.1 μm to about 5 μm.

6. The composition as claimed in claim 1, wherein the composition includes at least one additive selected from a dispersant, a plasticizer, a viscosity stabilizer, an anti-foaming agent, a UV stabilizer, an antioxidant, and a coupling agent.

7. A solar cell electrode produced from the composition for solar cell electrodes according to claim 1.

* * * * *